US005352631A

United States Patent [19]

Sitaram et al.

[11] Patent Number: 5,352,631

[45] Date of Patent: Oct. 4, 1994

[54] METHOD FOR FORMING A TRANSISTOR HAVING SILICIDED REGIONS

[75] Inventors: Arkalgud R. Sitaram; James R. Pfiester, both of Austin, Tex.

[73] Assignee: Motorola, Inc., Schaumburg, Ill.

[21] Appl. No.: 991,801

[22] Filed: Dec. 16, 1992

[51] Int. Cl.[5] .......................................... H01L 21/283

[52] U.S. Cl. ...................................... 437/200; 437/41; 437/44

[58] Field of Search ............................... 437/200, 201; 148/DIG. 106

[56] References Cited

U.S. PATENT DOCUMENTS

| | | | |
|---|---|---|---|
| 4,877,755 | 10/1989 | Rodder | 437/200 |
| 4,912,061 | 3/1990 | Nasr | 437/44 |
| 5,034,348 | 7/1991 | Hartswick et al. | 437/200 |
| 5,118,639 | 6/1992 | Roth et al. | 437/193 |

FOREIGN PATENT DOCUMENTS

| | | |
|---|---|---|
| 60-235473 | 11/1985 | Japan . |
| 1-300543 | 12/1989 | Japan . |

OTHER PUBLICATIONS

Hillenius et al., "A Symmetric Submicron CMOS Tech.", IEEE IEDM 1986, pp. 252-255.

"Thermal Stability of CoSi2 on Single Crystal and Polyscystalline Silicon", Phillips et al., Mat. Res. Soc. Symp. Proc. vol. 181, 1988 Mat. Res. Soc., pp. 159-164.

"Measurement of Lateral Dopant Dicffusion in Thin Silicide Layers", Chu et al., IEEE Trans. on Electron Devices, vol. 39, No. 10, Oct. 1992, pp. 2333-2340.

"A Refined Polycide Gate Process with Silicided Diffusions for Submicron MOS Applications", Norstrom et al., J. of the Elecrochem. Soc., vol. 136, No. 3, Mar. 1989, pp. 805-809.

"High Speed Super Self-Aligned Bipolar-CMOS Technology", Chiu et al., IEEE IEDM 1987, pp. 24-27 (May 1987).

"Ti Silicidation Technology for High Speed EPROM Devices", Kikuchi et al., 1983 Symp. on VLSI Technology, IEEE Electron Dev. Soc., pp. 112-113 (Sep. 1983).

"Comparison Between CoSi2 and TiSi2 as Dopant Source for Shallow Silicided Junction Formation", Van den hove et al., Proc. of the Europ. Worksh. on Refrac. Metals and Silic., Mar. 1989.

"A Self-Aligned Elevated Source/Drain MOSFET", by Pfiester et al., IEEE Electron. Dev. Letters, vol. 11, No. 9, Sep. 1990, pp. 365-367.

*Primary Examiner*—Olik Chaudhuri
*Assistant Examiner*—C. Everhart
*Attorney, Agent, or Firm*—Keith E. Witek

[57] ABSTRACT

A process for forming a transistor (10) begins by providing a substrate (12). Field oxide regions (14) or equivalent isolation is formed overlying or within the substrate (12). A gate oxide (16) and a conductive layer (18) are formed. A masking layer (20) is formed overlying the conductive layer (18). The masking layer (20) and the conductive layer (18) are etched to form a gate electrode and define a drain region (19) and a source region (21). Spacers (22) are formed adjacent the gate electrode. First silicided regions (26) are formed over the source and drain regions (21 and 19 respectively). The masking layer prevents the gate electrode from siliciding. The masking layer (20) is removed and a second silicided region (30) is formed overlying the gate electrode. The second silicided region (30) and the silicided regions (26) are made of different silicides.

20 Claims, 3 Drawing Sheets

METHOD FOR FORMING A TRANSISTOR HAVING SILICIDED REGIONS

FIELD OF THE INVENTION

The present invention relates generally to semiconductor technology, and more particularly, to a method for forming a transistor having silicided electrodes.

BACKGROUND OF THE INVENTION

Planar transistors in the integrated circuit industry are usually manufactured onto a semiconductor substrate, such as silicon. The semiconductor substrate, even when doped, is usually more resistive than most metal-containing materials. Resistive contacts and interconnects are not desirable for electrical circuits due to the fact that resistance limits maximum current flow, may create heat, and may result in reduced circuit accuracy, consistency, and performance. Therefore, metal oxide semiconductor (MOS) transistors which have silicided or salicided source regions, drain regions, and gate regions are typically used.

One method for forming a silicided/salicided drain, source, and gate for a transistor starts by providing a substrate. A gate, usually made of polysilicon is formed overlying the substrate. Source and drain regions are ion implanted and self-aligned to the gate. A layer of refractory metal, such as titanium, tantalum, platinum, nickel, and cobalt, is sputtered or deposited over the exposed source, drain, and gate regions. A heating step ranging from 200° C. to 650° C., which depends upon the type of metal used, is performed to form a self-aligned silicide region on the gate, drain, and source simultaneously. The silicide on the gate, source, and drain are all formed as the same silicide (i.e. one of either $CoSi_2$, $TiSi_2$, $TaSi_2$, or the like).

There are disadvantages to forming all of a transistor's electrodes (i.e. gate, source, and drain) with a single type of silicide region. For example, some silicides, such as platinum silicide, are not stable at high temperatures and will be damaged during subsequent high temperature processing. Furthermore, one silicide region is usually not advantageous for use with both current electrodes (i.e. source and drain) and gate electrodes. For example, cobalt silicide laterally diffuse dopants quickly at high temperatures (greater than 600° C.). This lateral diffusion may counter-dope or alter doping concentrations in gate regions and/or buried contact connection regions. Also, cobalt silicide is less thermally stable on polysilicon than on single crystalline silicon. Cobalt silicides degrade by agglomeration between 850° C. and 900° C. on polysilicon, whereas cobalt silicides are stable to 1000° C. on single crystalline silicon. Therefore, cobalt silicide is not an optimal gate electrode silicide. Titanium silicide has segregation coefficients with dopants such as boron, arsenic, and phosphorus, which results in under-doped or damaged source and drain contact regions, and unwanted titanium boride and/or titanium arsenide compounds formed at the silicide-silicon interface. Therefore, titanium silicide is not optimal for use with source and drain electrodes.

To overcome some of these disadvantages, transistors were formed by another method. This alternative method involved forming one silicide overlying the gate region, and another silicide overlying the source and drain regions. The method starts by providing a silicon substrate. A gate oxide, gate electrode (i.e. polysilicon), and refractory metal stack is formed over the substrate. The gate oxide, gate electrode (i.e. polysilicon), and refractory metal stack is etched, starting with the top refractory metal layer, to define gate electrodes. A heat cycle then reacts the refractory metal layer with the gate electrode to form a first silicide region self-aligned to the gate. A second refractory deposition or sputtering step is used to form a second refractory metal layer over the source and drain regions. A second heat cycle is used to form a second silicide region over the source and drain regions.

This method of forming a first silicided region and a second silicided region for an MOS transistor has some disadvantages. One disadvantage is that the etch processing required to etch a refractory metal over polysilicon is complicated and requires multiple etch steps. The etch steps may result in undercutting of the polysilicon gate and adverse alteration of transistor channel dimensions. The chemistries required for the etching of refractory metals and polysilicon do not result in adequate selectivity in some cases. Therefore, the etch steps used to remove the refractory metal and polysilicon may not consistently end point on a thin (i.e. 40–150 Angstrom) gate oxide, and may result in pitting of the substrate. The etch step described above will leave composite polysilicon/metal stringers (i.e. unwanted spacers) which are well documented in the art. These stringers are usually removed via an isotropic etch or an overetch process. These chemistries, when removing composite stringers are complex and not always successful. In some cases, an aggressive stringer removal process will also attack/damage the silicide regions.

Therefore, the need exists for an improved process which may be used to form a first silicide region for gate electrodes and a second silicide region for source and drain electrodes.

SUMMARY OF THE INVENTION

The previously mentioned disadvantages are overcome and other advantages achieved with the present invention. In one form, the present invention comprises a method for forming a transistor. A substrate is provided. A control electrode is formed overlying the substrate. The control electrode is formed having a top portion which functions as a masking layer. A source region and a drain region are formed within the substrate. The source and drain regions are adjacent the control electrode. A first silicided region is formed over the source and the drain regions. The top portion of the control electrode which functions as a masking layer is removed. A second silicided region is formed over the control electrode.

The present invention will be more clearly understood from the detailed description below in conjunction with the accompanying drawings.

DESCRIPTION OF A PREFERRED EMBODIMENT

Figure 1:
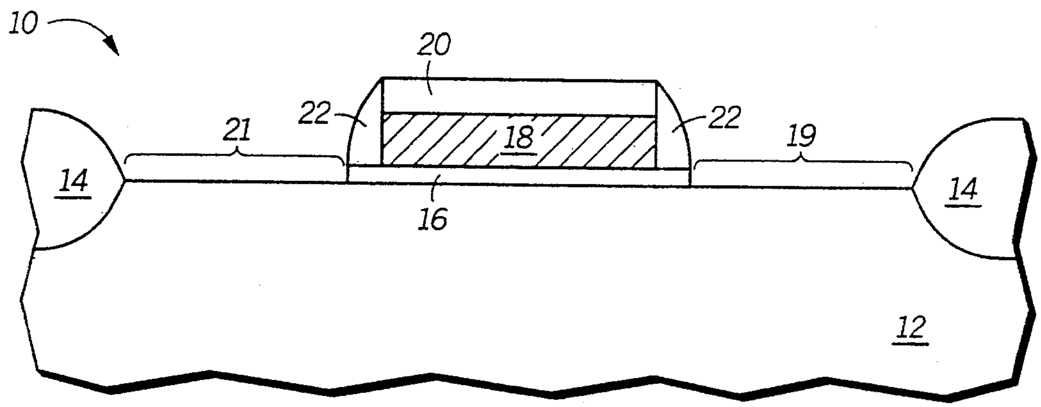
FIGS. 1–5 illustrate, in cross-sectional form, a method for forming a transistor having silicided regions in accordance with the present invention.

Illustrated in FIGS. 1-5 is a method for forming a transistor 10. In FIG. 1, a substrate 12 is illustrated. Substrate 12 may be made of silicon, gallium arsenide, silicon on sapphire (SOS), epitaxial formations, germanium, germanium silicon, diamond, silicon on insulator (SOI) material, and/or like substrate materials. Preferably, the substrate 12 is made of silicon. Field oxide regions 14 are formed via conventional and widely known techniques. Other isolation schemes, such as trench isolation, may be used instead of a local oxidation of silicon (LOCOS) field oxide scheme. The dielectric layers described herein may be wet or dry silicon dioxide ($SiO_2$), a nitride material, tetra-ethyl-ortho-silicate (TEOS) based oxides, boro-phosphate-silicate-glass (BPSG), phosphate-silicate-glass (PSG), boro-silicate-glass (BSG), oxide-nitride-oxide (ONO), tantalum pentoxide ($Ta_2O_5$), plasma enhanced silicon nitride (P-$SiN_x$), titanium oxide, oxynitride, and/or like dielectric materials. Specific dielectrics are noted herein when a specific dielectric material is preferred or required.

A gate oxide 16 is formed overlying the substrate 12. Gate oxide 16 is usually formed as a silicon dioxide material, but may be a composite oxide, such as TEOS and silicon dioxide, a nitrided oxide layer, or a like gate dielectric. A control electrode conductive layer 18 is formed overlying the gate oxide 16. In a preferred form, the conductive layer 18 is either polysilicon or amorphous silicon or a combination of both. In some cases, the conductive layer 18 may be made of another semiconductive or conductive material as is well known in the art. Conductive layer 18 may be in-situ doped with dopant atoms or ion implanted with dopant atoms to alter a conductivity of conductive layer 18. Typical dopant atoms are phosphorus, arsenic, and boron, but other atoms, such as germanium atoms, may be ion implanted.

A masking layer 20 is formed overlying the conductive layer 18. The masking layer 20 is preferably a dielectric material, such as nitride, but may be made of another material or a plurality of materials. In general, masking layer 20 may be any material which may be etched selective to field oxide 14 and conductive layer 18. In addition, it would be advantageous if masking layer 20 is also not capable of salicidation or silicidation.

In FIG. 1, the masking layer 20 and the conductive layer 18 are etched via conventional photolithographic, masking, and etch techniques to form a control electrode or gate electrode from conductive layer 18. The gate electrode has a self-aligned protective top portion formed by masking layer 20. The etching, which is used to form the conductive control electrode (i.e. gate), also forms a sidewall of the conductive layer 18.

In FIG. 1, a spacer 22 is formed laterally adjacent the sidewall of the conductive layer 18. A sidewall oxidation step, which is used to isolate the sidewall of the conductive layer 18, may optionally be performed before the spacer 22 is formed. In general, the spacer 22 is formed as a dielectric material which is not significantly etched in the chemistry used to etch masking layer 20. For example, the spacer 22 is a TEOS spacer or a like dielectric spacer if the masking layer 20 is a nitride material (i.e. silicon nitride). A nitride spacer may be used but will not provide the selectivity required to easily manufacture a transistor with a high yield.

Portions of the gate oxide 16 are removed to form exposed portions of the substrate 12. The exposed portions of the substrate 12 are referred to as a drain region 19 and a source region 21. The removal of portions of gate oxide 16 occurs either after the spacer 22 is formed or during formation of the spacer 22. It is known in the art that, in most cases, the source and drain are formed in a symmetrical manner and therefore may be interchanged (i.e. the source may be a drain and the drain may be a source) without affecting the transistor 10 in any manner.

Figure 2:
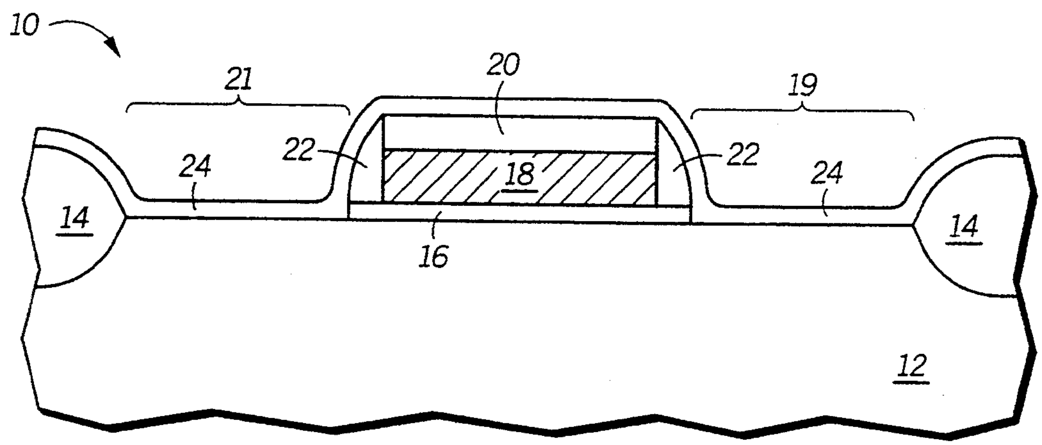

In FIG. 2, a metal layer 24 is formed overlying the source and drain regions 21 and 19. The metal layer 24 is formed by one of either sputtering, chemical vapor deposition (CVD), or evaporation. The metal layer 24 may comprise any metal such as platinum, titanium, tantalum, nickel, cobalt, tungsten, and/or the like. In a preferred form, cobalt is used to form metal layer 24. Cobalt is preferred due to the fact that cobalt silicides have dopant diffusion and segregation coefficients that allow for formation of shallow conformal source and drain junctions.

Figure 3:
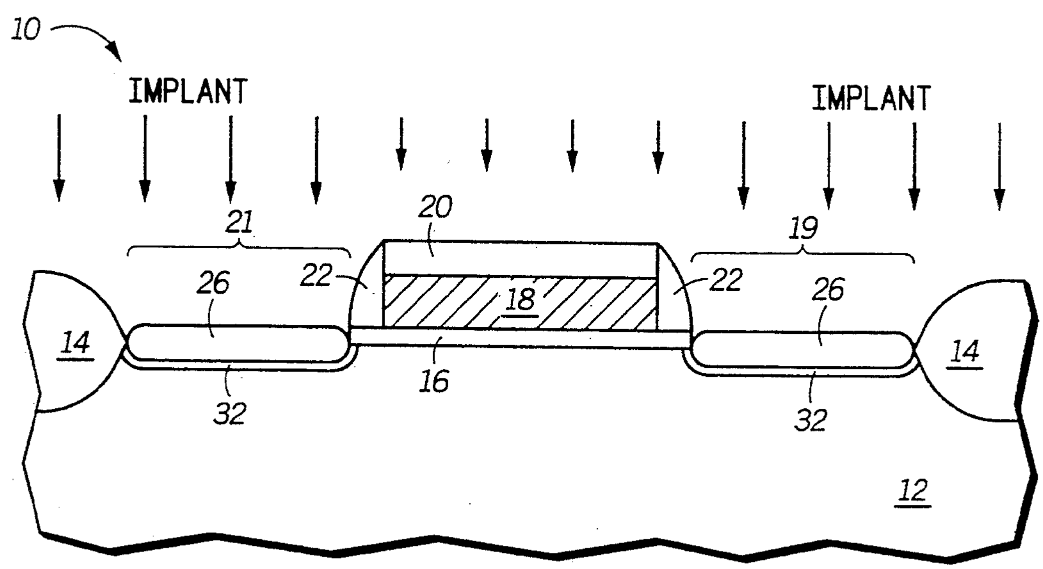

In FIG. 3, a heating cycle is performed. The heating cycle is used to react the portions of metal layer 24 which overlie the source and drain regions 21 and 19 with the substrate 12. If the metal layer 24 comprises cobalt and the substrate 12 is silicon, then the cobalt reacts with the silicon within regions 21 and 19 to form cobalt silicide ($CoSi_2$). Typical heat cycle temperatures for silicide/salicide formation range From 200° C. to 700° C. depending on the type of metal used. In all cases, silicided regions 26 (also referred to as salicided regions in some cases) are formed within regions 19 and 21 via the heating cycle. All unreacted portions of the metal layer 24 are removed via known etch techniques without removing the silicided regions 26. For example, cobalt may be etched using an HCl and water isotropic etch chemistry.

It is important to note that the masking layer 20 prevents the conductive layer 18 (i.e. gate) from being silicided/salicided in FIG. 3.

At this point in time, an ion implant step illustrated in FIG. 3 may be used to dope the silicide regions 26 with dopant atoms. Either boron, arsenic, or phosphorus may be used alone or in any combination as the dopant atoms. Therefore, either an N-channel transistor or a P-channel transistor may be formed. In a preferred form, the dopant atoms are ion implanted at an energy which places the dopant atoms only in the silicided regions 26. Another healing cycle is used to drive the dopant atoms from the silicided regions 26 into the substrate 12 to form current electrodes 32 (i.e. a source and a drain electrode). In another form, the ion implant of the dopant atoms may be performed at a high energy to ensure that the dopant atoms penetrate the silicided regions 26 and form current electrodes 32. It is important to note that the ion implantation of the silicided regions 26 to form current electrodes 32 may be performed at any point in time in the process of FIGS. 1-5. A self-aligned process is preferred but is optional.

In addition, the ion implant step which is used to form the current electrodes 32 may optionally be used to dope the conductive layer 18 simultaneously. In some cases, simultaneously doping the source, drain, and gale in one implant is advantageous because masking and implant steps are reduced. In other cases, the doping of the source/drain and gate are very critical to transistor performance and must be independently doped for optimal operation. The ion implanting of the gate may be performed through the masking layer 20 or may be performed after the masking layer 20 is removed (see FIG. 4).

Figure 4:
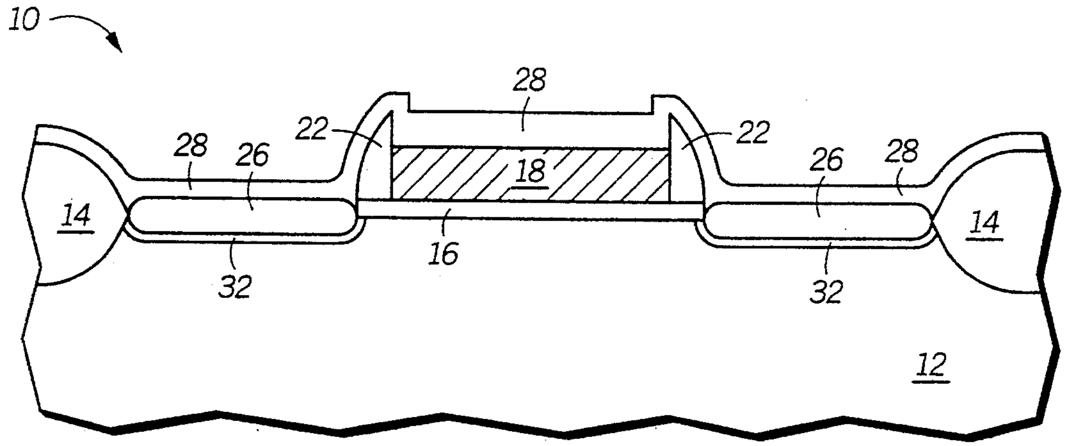

In FIG. 4, the masking layer 20 is removed and a second metal layer 28 is formed overlying the conductive layer 18. If any stringers (not illustrated) result from the removal of the masking layer 20, a selective isotropic etch, such as hot phosphoric, may be used to remove the stringers. An optional thermal oxidation step may be used to isolate the silicided regions 26 from the metal layer 28. Metal layer 28 is formed via sputtering, chemical vapor deposition (CVD), or evaporation. In a preferred form, the metal layer 28 comprises a refractory metal such as titanium.

In the art, it is known that if an N-channel transistor is formed with an N type gate electrode, superior performance results. In a like manner, if a P-channel transistor is formed with a P type gate electrode, superior performance results. Therefore, in an ideal complementary metal oxide semiconductor (CMOS) process, the gates of P-channel transistors are doped differently from the gates of N-channel transistors. Unfortunately, silicided gate electrodes, which are usually formed in a single polysilicon level, tend to laterally diffuse dopant atoms. This lateral diffusion results in N type dopant areas counter-doping P type dopant areas and vice-versa. This counter-doping results in undesirable reduced conductivity of the gate electrode and gate interconnects and a reduction in the performance. It is known that titanium silicide reduces the unwanted lateral dopant diffusion (i.e. counter-doping). Therefore, titanium is a preferred metal for forming the metal layer 28.

In FIG. 4, the spacers 22 are illustrated as rising above a top surface of the conductive layer 18. This characteristic of spacer 22 may be advantageous due to the fact that the spacer 22, when raised vertically above a top portion of the conductive layer 18, will function to impede lateral and sidewall silicidation/salicidation and encroachment. If this characteristic of spacer 22 is not desired, a brief reactive ion etch (RIE) etch or the like may be used to shorten the height of the spacers 22.

Figure 5:
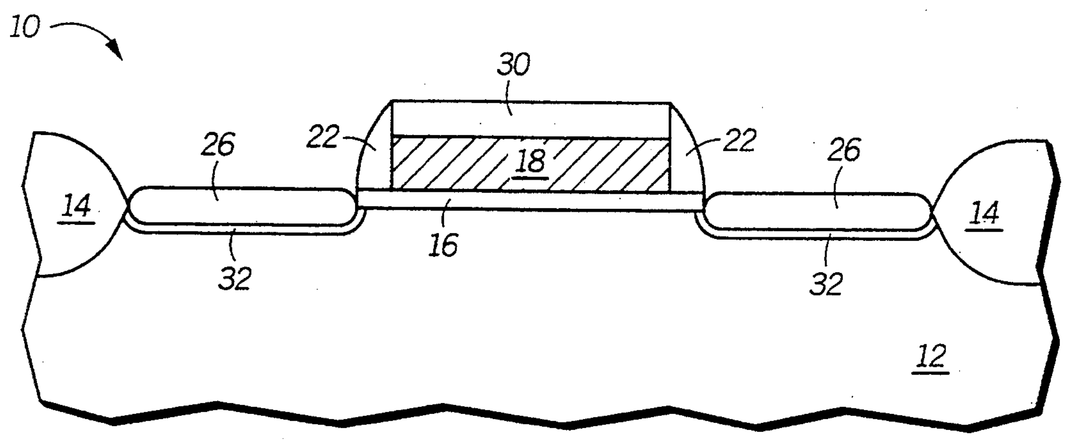

In FIG. 5, a heating cycle is used to react the metal layer 28 with the conductive layer 18 to form a silicided region 30. It is important to note that the silicided regions 26 and the silicided region 30 are formed via different metal materials (i.e. preferably cobalt and titanium respectively). Therefore, the silicide over the gate and the silicide over the source and drain regions are optimized. Unreacted portions of metal layer 28 may be removed via an $NH_4OH/H_2O_2$ combination.

As stated previously, there are disadvantages to forming all of the electrodes (i.e. gate, source, and drain) with a single type of silicide region. Some silicides, such as platinum silicide, are not stable at high temperatures and will be damaged during subsequent high temperature processing. Furthermore, one silicide region is usually not advantageous for use on both current electrodes (i.e. source and drain) and gate electrodes. For example, cobalt silicide laterally diffuses dopants quickly at higher temperatures, but allows for shallow, high performance source and drain formation. Therefore, cobalt silicide is not an optimal gate electrode silicide but is a good silicide region for both sources and drains when compared to other silicides. Titanium silicide has segregation coefficients with dopants such as boron, arsenic, and phosphorus, which result in under-doped or damaged source and drain contact regions. Damage may result due to the fact that standard ion implants must either go through the titanium silicide or be performed before the titanium silicide is formed, thereby resulting in substrate damage. Titanium silicide is therefore not optimal for a source/drain silicide region. Conversely, titanium silicide laterally diffuses dopant atoms less than most other silicides and is therefore a better gate silicide than most other silicides. Therefore, the process taught herein may be used to form a transistor which has superior performance over a single silicided transistor.

Furthermore, conventional processes which are used to form gate silicides which are different from source/drain silicides have various disadvantages. The other processes require complex etch processing in order to etch a refractory metal over polysilicon. Multiple etch steps and etch equipment may be required. The prior art etch steps may result in undercutting of the polysilicon gate and adverse alteration of transistor channel dimensions. The prior art chemistries required to etch the refractory metals and polysilicon do not result in adequate selectivity in some cases. Therefore, the etch steps used to remove the refractory metal and polysilicon may not consistently end point on a thin (i.e. 80–150 Angstroms) gate oxide, and may result in pitting of the substrate. The prior art etch steps will leave composite metal/polysilicon stringers (i.e. undesirable spacers) which are well documented in the art. These stringers are usually removed via an isotropic etch or overetch process. If an aggressive etch is used for stringer removal, then the silicide regions may be etched, removed, or damaged. Furthermore, removing composite stringers is difficult and not always successful.

The process taught herein allows for improved formation of the gate electrode and silicided regions (i.e. no multiple complex etch steps are required). In addition, stringers may be removed after the gate etch by using simple and repeatable etch processing, unlike the prior art. In general, the process taught herein is more reliable than existing double silicide transistor processes. Furthermore, titanium silicide and cobalt silicide are both stable at high temperatures (i.e. temperatures greater than 800° C.).

Figure 6:
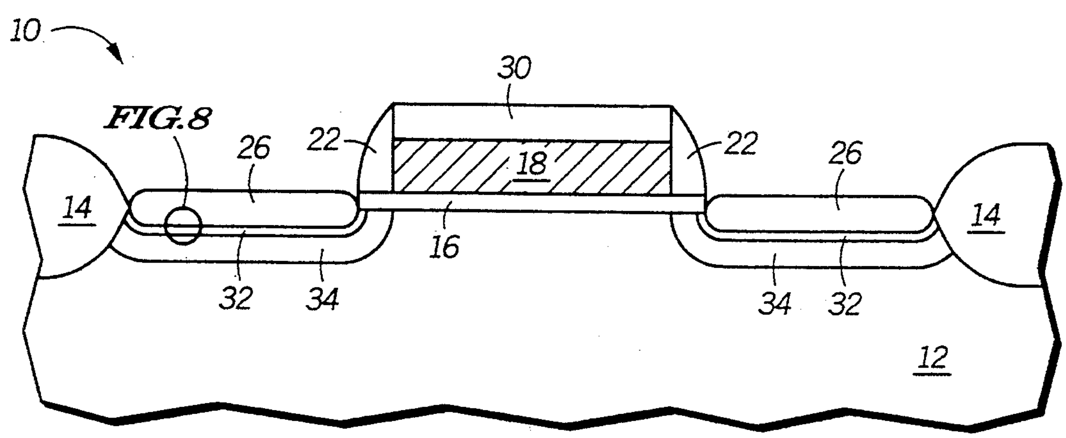
FIG. 6 illustrates, in cross-sectional form, another transistor having silicided regions in accordance with the present invention.

FIG. 6 illustrates that the spacers 22 may be used to form lightly doped drain (LDD) regions 34. LDD regions are well known in the art and may be easily integrated into the process taught herein.

Figure 7:
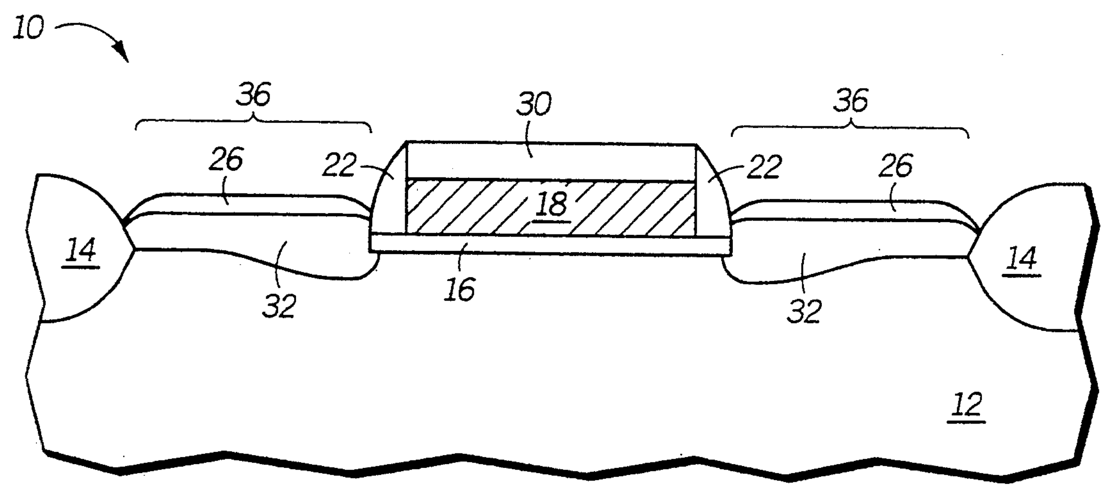
FIG. 7 illustrates, in cross-sectional form, yet another transistor having silicided regions in accordance with the present invention.

In FIG. 7, a selective or epitaxial growth step is used to vertically elevate the surface of the source and drain electrodes within regions 36. Elevated source and drain technology is well known in the art and may be easily integrated into the process taught herein.

Figure 8:
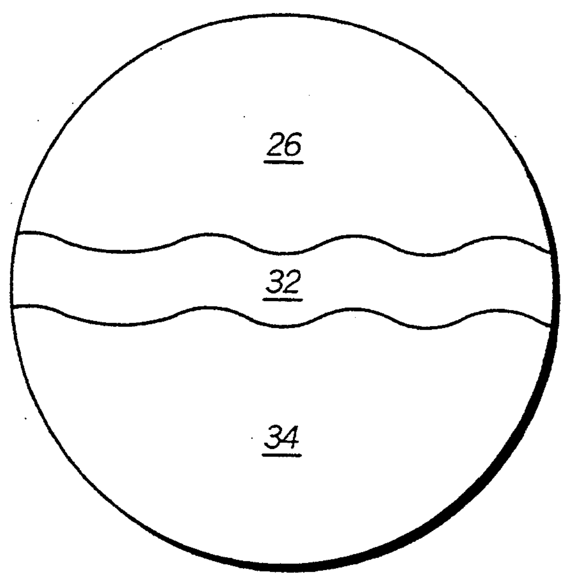
FIG. 8 illustrates, in cross-sectional form, a magnified view of a bottom portion of a silicided region of FIG. 6.

FIG. 8 illustrates a magnified view of a portion of FIG. 6. FIG. 8 illustrates that cobalt silicide (i.e. silicided regions 26) diffuses shallow junctions into the substrate 12 (i.e. source and drain regions 32 are vertically thin). Cobalt silicide forms a rough interface with silicon, as illustrated in FIG. 8. Normally, this interface could cause difficulties when ion implanting the source and drain regions 32. If the ion implant step illustrated in FIG. 3 is of low enough energy to confine the dopant atoms to the silicide regions 26, then a heating cycle may be used to drive the dopant atoms out of the silicide to form shallow source/drain junctions as illustrated in FIG. 8. The source and drain electrodes follow the surface contour of the silicide regions 26 and form a shallow junction. In addition, by ion implanting only into the silicide regions 26, ion implant damage is localized in the silicide and no ion implant damage results within the substrate 12 or the current electrodes. Damage to the substrate 12 or the current electrodes may result in degradation of transistor performance.

It is important to note that the FIGS. 1–8 may not be completely drawn to scale. In most cases, gate oxide layers and silicided regions are thinner than illustrated.

While the present invention has been illustrated and described with reference to specific embodiments, further modifications and improvements will occur to those skilled in the art. For example, the method taught herein may be used to form devices other than transistors, such as electrically erasable programmable read only memories (EEPROMs), electrically programmable read only memories (EPROMs), flash EPROMs, thyristers, diodes, thin film transistors (TFTs), and the like. Many refractory metals and silicides exist and may be used with the process taught herein. Many different structures of transistors exist in the art and may be double salicided/silicided as taught herein. Gate electrodes may be doped prior to patterning, after patterning, or simultaneously with the source and drain. Thermal oxidation processes may be performed on the source and drain before removal of masking layers for added substrate protection. It is to be understood, therefore, that this invention is not limited to the particular forms illustrated and that it is intended in the appended claims to cover all modifications that do not depart from the spirit and scope of this invention.

We claim:

1. A method for forming a transistor comprising the steps of:

providing a substrate;

forming a control electrode overlying the substrate, the control electrode having a top portion made of a dielectric material which functions as a masking layer;

forming a sidewall spacer laterally adjacent the control electrode;

forming a source region and a drain region within the substrate and adjacent the control electrode;

forming a first silicided region over the source and the drain regions;

removing the top portion of the control electrode which functions as a masking layer selective to the sidewall spacer to form an exposed portion of the control electrode; and forming a second silicided region over the exposed portion of the control electrode.

2. The method of claim 1 wherein the steps of forming the second silicided region further comprises:

using the second silicided region to reduce lateral doping diffusion of dopant atoms within the control electrode.

3. The method of claim 1 wherein the step of forming the first silicided region comprises:

forming the first silicided region as cobalt salicide; and the step of forming the second silicided region comprises:

forming the second silicided region as selective titanium salicide.

4. The method of claim 1 wherein the step of forming the first silicided region further comprises:

forming a first metal layer overlying the source and drain regions; and forming the first silicided region by heating the first metal layer; and the step of forming the second silicided region further comprises:

forming a second metal layer overlying the control electrode; and forming the second silicided region by heating the second metal layer.

5. The method of claim 1 further comprising a step of:

vertically elevating the source and drain regions via a selective growth process.

6. The method of claim 1 further comprising a step of:

forming each of the source and drain regions to make the transistor a lightly doped drain (LDD) transistor.

7. The method of claim 1 wherein the step of forming a control electrode comprises:

forming a conductive control electrode layer;

forming a nitride dielectric layer overlying the conductive control electrode layer; and etching the nitride dielectric layer and the conductive control electrode layer to form the control electrode overlying the substrate, the nitride dielectric layer being the top portion of the control electrode which functions as the masking layer.

8. The method of claim 1 wherein the step of forming the source region and the drain region comprises:

ion implanting the source region and the drain region to form the source region and the drain region self-aligned to the control electrode.

9. The method of claim 1 wherein the step of forming the source and drain regions comprises:

ion implanting the source and drain regions to form source and drain regions within the substrate and simultaneously doping the control electrode.

10. A method for forming a metal oxide semiconductor (MOS) transistor comprising the steps of:

providing a substrate;

forming a conductive control electrode layer having a top surface;

forming a dielectric layer overlying the conductive control electrode layer, the dielectric layer being a nitride material;

etching the dielectric layer and the conductive control electrode layer to form a control electrode overlying the substrate, the dielectric layer forming a masking layer over a top portion of the conductive control electrode layer;

forming a source region and a drain region within the substrate;

forming an oxide sidewall spacer laterally adjacent the conductive control electrode;

forming a first silicided region over the source and the drain regions, the first silicided regions being cobalt silicide;

removing the masking layer selective to the oxide sidewall spacer wherein a top portion of the oxide sidewall spacer extends above the top surface of the conductive control electrode; and forming a second silicided region over the control electrode, the second silicide region being titanium silicide.

11. The method of claim 10 wherein the step of forming the first silicided region comprises:

using the first silicide to allow for the ion implantation and diffusion of shallow source and drain regions from the first silicide region.

12. The method of claim 10 wherein the step of forming the first silicided region further comprises:

forming a first metal layer overlying the source and drain regions; and forming the first silicided region by heating the first metal layer; and the step of forming the second silicided region further comprises:

forming a second metal layer overlying the control electrode; and forming the second silicided region by heating the second metal layer.

13. The method of claim 10 further comprising a step of:

vertically elevating the source and drain regions via a selective growth process.

14. The method of claim 10 further comprising a step of:

forming each of the source region and the drain region to make the transistor a lightly doped drain (LDD) transistor.

15. The method of claim 10 wherein the step of forming the source region and the drain region comprises:

ion implanting the source region and the drain region to form both the source region and the drain region within the substrate and simultaneously doping the control electrode.

16. A method for forming a transistor comprising the steps of:

providing a substrate;

forming a control electrode overlying the substrate, the control electrode having a top portion which functions as a masking layer which prevents silicidation of the control electrode, the top portion which functions as a masking layer being a nitride dielectric material;

forming a source region and a drain region within the substrate and adjacent the control electrode;

forming an oxide sidewall spacer laterally adjacent the control electrode;

forming a first metal layer overlying the source region and the drain region;

forming a first silicided region by heating the first metal layer, the heating reacting the first metal layer with the source region an the drain region to form cobalt silicide which allows for the formation of shallow source and drain regions;

removing the top portion of the control electrode which functions as a masking layer selective to the oxide sidewall spacer wherein a portion of the oxide sidewall spacer extends above the control electrode due to the selectivity of the step of removing;

forming a second metal layer overlying the control electrode; and forming the second silicided region, which is different form the first silicided region, by heating the second metal layer, the heating reacting the second metal layer with the control electrode to form titanium silicide which reduces lateral doping diffusion of dopant atoms in the control electrode.

17. The method of claim 16 wherein the step of forming a control electrode further comprises:

forming a conductive control electrode layer;

forming a nitride dielectric layer overlying the conductive control electrode layer; and etching the nitride dielectric layer and the conductive control electrode layer to form the control electrode overlying the substrate, the nitride dielectric layer being the top portion of the control electrode which functions as a masking layer.

18. The method of claim 16 wherein the step of forming the first silicided region comprises:

forming the first silicide region as selective cobalt silicide; and the step of forming the second silicided region comprises: forming the second silicided region as selective titanium silicide.

19. The method of claim 16 wherein the step of forming the source region and the drain region comprises:

ion implanting the source region and the drain region to form the source region and the drain region within the substrate and simultaneously doping the control electrode.

20. The method of claim 16 further comprising a step of:

forming each of the source region and the drain region as a lightly doped drain (LDD) electrode.

* * * * *